United States Patent

Kawabata et al.

Patent Number: 5,368,990
Date of Patent: Nov. 29, 1994

[54] PHOTOPOLYMERIZABLE COMPOSITION

[75] Inventors: Masami Kawabata, Takatsuki; Akihiko Sato, Suita; Iwao Sumiyoshi, Osaka, all of Japan

[73] Assignee: Nippon Paint Co., Ltd., Osaka, Japan

[21] Appl. No.: 923,977

[22] PCT Filed: Jan. 22, 1992

[86] PCT No.: PCT/JP92/00044
§ 371 Date: Nov. 5, 1992
§ 102(e) Date: Nov. 5, 1992

[87] PCT Pub. No.: WO92/13008
PCT Pub. Date: Aug. 6, 1992

[30] Foreign Application Priority Data

Jan. 22, 1991 [JP] Japan ................ 3-005569

[51] Int. Cl.$^5$ .................................. G03C 1/73
[52] U.S. Cl. .................................. 430/281; 430/920; 522/25; 522/26
[58] Field of Search ................ 430/281, 920; 522/25, 522/26

[56] References Cited

U.S. PATENT DOCUMENTS

| | | | |
|---|---|---|---|
| 4,735,632 | 4/1988 | Oxman et al. | 522/25 |
| 4,868,092 | 9/1989 | Kawabata et al. | 430/281 |
| 4,965,171 | 10/1990 | Kawabata et al. | 430/281 |
| 5,102,775 | 4/1992 | Okuhara et al. | 522/25 |

FOREIGN PATENT DOCUMENTS

| | | |
|---|---|---|
| 58-29803 | 2/1983 | Japan . |
| 60-76735 | 5/1985 | Japan . |
| 60-76740 | 5/1985 | Japan . |
| 60-78443 | 5/1985 | Japan . |
| 60-92302 | 5/1985 | Japan . |
| 60-96604 | 5/1985 | Japan . |
| 61-213838 | 9/1986 | Japan . |

Primary Examiner—Marion E. McCamish
Assistant Examiner—Mark A. Chapman
Attorney, Agent, or Firm—Wenderoth, Lind & Ponack

[57] ABSTRACT

A photopolymerizable composition comprising an addition polymerizable compound having an ethylenically unsaturated double bond and a photopolymerization initiating composition, said photopolymerizable initiating composition comprising (a) a dye of the formula:

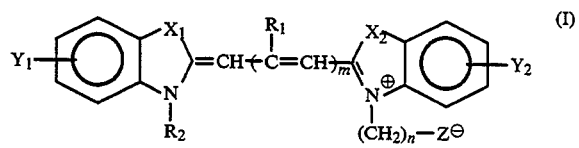

[wherein $R_1$ is H, an alkyl group having 1 to 3 carbon atoms, a phenyl group or a halogen atom; $R_2$ is a methyl group, an ethyl group or $(CH_2)_p$-Q (wherein Q is a carboxyl group, a sulfonyl group or salt thereof and p is an integer of 1 to 4); $X_1$ and $X_2$ are independently —O—, —S—, —CH=CH— or >N—$R_2$; $Y_1$ and $Y_2$ are independently H, an alkyl group having 1 to 3 carbon atoms, an alkoxy group having 1 to 3 carbon atoms, a phenyl group or a halogen atom; Z is —COO or —SO$_3$; m is 0 or 1; and n is an integer of 1 to 4] and (b) diaryliodonium salt as a polymerization initiator.

2 Claims, No Drawings

PHOTOPOLYMERIZABLE COMPOSITION

DESCRIPTION

1. Technical Field

The present invention relates to a photopolymerizable composition having sensitivity to a visible ray or near infrared ray.

2. Background Art

Regarding photopolymerizable compositions having sensitivity to a visible ray, since drawing can be directly conducted using a laser beam as a light source, they are expected to be used as printing materials or photosensitive materials for a hologram.

To these photopolymerizable compositions, dyes having absorption at visible ray or near infrared ray range are generally added as a sensitizer for imparting sensitivity to a visible ray.

Accordingly, these photopolymerizable compositions are colored depending on a dye contained therein.

These photopolymerizable compositions can not be used in the field wherein clear transparency is required, for example a hologram.

As a method for solving such a problem, for example, there is a method of using cyanine dyes as a sensitizer for photopolymerizable compositions, which is disclosed in Japanese Patent Kokai Nos. 58-29803 and 61-213838. Since cyanine dyes are liable to cause decoloring or fading by light irradiation, a clear transparent hologram can be obtained by using photopolymerizable compositions disclosed in the above references.

However, these photopolymerizable compositions have a disadvantage that storage stability is inferior.

The present invention has been completed in order to solve the above problems and the object thereof is to provide a photopolymerizable composition having excellent storage stability and excellent sensitivity to a visible ray (particularly, a visible ray having a wavelength of not more than 550 nm), which is capable of decoloring by light irradiation.

DISCLOSURE OF THE INVENTION

The present invention provides a photopolymerizable composition comprising an addition polymerizable compound having an ethylenically unsaturated double bond and a photopolymerization initiating composition, said photopolymerizable initiating composition comprising (a) a dye of the formula:

$$Y_1-\underset{\underset{R_2}{|}}{\underset{N}{\overset{X_1}{\bigcirc}}}=CH \text{\textcent} C=CH \overset{R_1}{)}_m \underset{\underset{(CH_2)_n-Z^{\ominus}}{|}}{\overset{X_2}{\underset{N^{\oplus}}{\bigcirc}}}-Y_2 \quad (I)$$

[wherein $R_1$ is H, an alkyl group having 1 to 3 carbon atoms, a phenyl group or a halogen atom; $R_2$ is a methyl group, an ethyl group or $(CH_2)_p$-Q (wherein Q is a carboxyl group, a sulfonyl group or salt thereof and p is an integer of 1 to 4); $X_1$ and $X_2$ are independently —O—, —S—, —CH=CH— or >N—$R_2$; $Y_1$ and $Y_2$ are independently H, an alkyl group having 1 to 3 carbon atoms, an alkoxy group having 1 to 3 carbon atoms, a phenyl group or a halogen atom; Z is —COO or —SO$_3$; m is 0 or 1; and n is an integer of 1 to 4] and (b) diaryliodonium salt as a polymerization initiator, whereby, the above object can be accomplished.

The dye (a) as a sensitizer to be formulated in the photopolymerizable composition of the present invention is the compound of the above formula (I), and examples thereof include 3,3'-dicarboxymethyl-2,2'-thiacyanine inner salt, 3,3'-dicarboxyethyl-5,5',9-trimethyl-2,2'-thiacarbocyanine inner salt, 3,3'-dicarboxymethyl-5,5'-dimethoxy-2,2'-thiacyanine inner salt, 3,3'-dicarboxymethyl-5,5'-dichloro-2,2'-thiacyanine inner salt, 3-ethyl-3'-carboxymethyl-2,2'-thiacyanine inner salt, 1-ethyl-3'-carboxymethyl-2,2'-quinothiacyanine inner salt, 1,3'-carboxymethyl-2,2'-quinothiacyanine inner salt, 1-ethyl-4-methoxy-3'-carboxymethyl-5'-chloro-2,2'-quinothiacyanine inner salt, 1-ethyl-4-methoxy-3'-(4-sulfobutyl)-2,2'-quinothiacyanine inner salt, 1-ethyl-(4-sulfobutyl)-5,5'-dichloro-2,2'-quinothiacyanine inner salt, anhydro-5,5'-diphenyl-9-ethyl-3,3'-disulfopropyloxacarbocyanine hydroxide triethylamine salt, anhydro-5,5'-dichloro-9-ethyl-3,3'-disulfopropyloxacarbocyanine sodium salt, 1-carboxymethyl-1'-carboxyethyl-2,2'-quinothiacyanine inner salt, 1,1'-diethyl-3,3'-dicarboxymethyl-5,6,5',6'-tetrachloro-2,2'-benzimidazolocarbocyanine inner salt and the like.

The diaryliodonium salt (b) as a polymerization initiator to be formulated in the photopolymerizable composition of the present invention is the compound of the formula:

$$\underset{R_3}{\overset{R_2}{\bigcirc}}-I^+-\underset{R_5}{\overset{R_4}{\bigcirc}} \quad Z^- \quad (II)$$

[wherein $R_2$ to $R_5$ are independently hydrogen atom, halogen atom (e.g. chlorine, fluorine, etc.), lower alkyl group (e.g. methyl, ethyl, propyl, t-butyl, etc.), lower alkoxy group (e.g. methoxy, ethoxy, propoxy, etc.) or nitro group; $Z^-$ is halogen ion (e.g. $Cl^-$, $Br^-$, $I^-$, etc.), hydroxyl ion, $HSO_4^-$, $ClO_4^-$, $CF_3SO_3^-$, $BF_4^-$, $PF_6^-$, $AsF_6^-$ or $SbF_6^-$]. Examples of the compound represented by the formula (II) include chlorides, bromides, perchlorates, trifluoromethylsulfonates, tetrafluoroborates, hexafluorophosphates, hexafluoroarcenates, hexafluoroantimonates, etc. of iodoniums such as diphenyliodinium, bis(p-chlorophenyl)iodonium, ditolyliodonium, bis(p-t-butylphenyl)iodonium, bis(m-nitrophenyl)iodonium and the like.

The photopolymerizable composition of the present invention can be essentially obtained by formulating a dye (a) as a sensitizer and a diaryliodonium salt (b) into an addition polymerizable compound (d) having an ethylenically unsaturated double bond. Regarding the addition polymerizable compound having an ethylenically unsaturated double bond, the addition polymerization is initiated by the effect of a photopolymerization initiation composition upon light irradiation and, as a result, the part irradiated is cured and is substantially insolubilized. Examples of the compound include unsaturated carboxylic acids such as acrylic acid, methacrylic acid, itaconic acid, maleic acid and the like; esters of polyhydroxy compounds (e.g. ethylene glycol, tetraethylene glycol, neopentylglycol, propylene glycol, 1,2-butanediol, trimethylolpropane, pentaerythritol, tripentaerythritol, etc.) with the above unsaturated carboxylic acids; addition reaction products of epoxide compounds (e.g. trimethylolpropane polyglycidyl ether, pentaerythritol polyglycidyl ether, propylene glycol diglycidyl ether, etc.) with the above unsaturated carboxylic acids; polyurethane acrylates and polyurethane methacrylates synthesized from polyfunctional isocyanate compounds (e.g. hexamethylene diisocyanate, 2,4-tolylene diisocyanate, isophorone diisocyanate, 4,4'-methylenebis(phenylisocyanate), etc.), acrylic esters or methacrylic esters having a hydroxyl group (e.g. 2-hydroxypropyl acrylate, 2-hydroxypropyl methacrylate, 2-hydroxypropyl acrylate, 2-hydroxypropyl methacrylate, etc.) and the above polyhydroxy compounds; acrylamides and methacrylamides such as acrylamide, ethylene-bis-acrylamide, ethylene-bis-methacrylamide, hexamethylene-bis-acrylamide, hexamethylene-bis-methacrylamide and the like. Preferably, acrylic esters or methacrylic esters are used.

The photopolymerizable composition having sufficient sensitivity is normally obtained from a composition comprising a dye (a), a diaryliodonium salt (b) and an addition polymerizable compound (d) having an ethylenically unsaturated double bond. When higher sensitivity is required, it is preferred to further formulate an auxiliary sensitizer (c) of the formula (III):

(c) $R_3\text{-}A\text{-}CH_2COOH$        (III)

[wherein $R_3$ is a phenyl group or a substituted phenyl group and A is —O—, —S—, a secondary nitrogen atom or a tertiary nitrogen atom].

Examples of this compound include phenoxyacetic acid, O-chlorophenoxyacetic acid, N-phenylglycine, N-(P-methoxyphenyl)glycine, N-(P-chlorophenyl)glycine, N-hydroxyethyl-N-phenylglycine, N-(2-hydroxy-3-methacryloxypropyl)-N-phenylglycine and the like.

The amount of the component (a) is 0.001 to 0.1 parts by weight, preferably 0.004 to 0.03 parts by weight and the amount of the components (b) and (c) is 0.01 to 0.2 parts by weight, preferably 0.03 to 0.1 parts by weight, respectively, based on 1 part of the component (d). The amount of the component (a) varies depending upon the thickness of the photopolymerizable composition to be applied. When the amount of the components (a), (b) and (c) is less than the above range, sensitivity is deteriorated and it takes a long time to insolubilize (cure) the composition. When the amount is more than the above range, storage stability is deteriorated, or strength and solvent solubility resistance of the film formed are deteriorated.

The photopolymerizable composition of the present invention may contain, if necessary, polymer binders, thermopolymerization inhibitors, plasticizers, colorants and the like. The polymer binders are used for improving various properties such as compatibility, film-forming property, adhesion property and the like, and suitable kinds of them may be used according to the objects.

The composition of the present invention may be prepared by a normal method. For example, it can be prepared by formulating the above essential components as they are, or optionally formulating the components together with a solvent [e.g. ketone solvents such as methyl ethyl ketone, acetone, cyclohexanone, etc.; ester solvents such as ethyl acetate, butyl acetate, ethylene glycol diacetate, etc.; aromatic solvents such as toluene, xylene, etc.; cellosolve solvents such as methyl cellosolve, ethyl cellosolve, butyl cellosolve, etc.; alcohol solvents such as methanol, ethanol, propanol, etc.; ether solvents such as tetrahydrofuran, dioxane, etc.; halogen solvents such as dichloromethane, chloroform, etc.] and mixing then in a dark place, for example, with a high speed mixer.

The photosensitive layer can be formed by applying the photosensitive composition of the present invention on a substrate, for example, with a bar coater, applicator or spinner and drying according to a normal method. Further, a known technique for protecting the surface and preventing bad influence such as deterioration of sensitivity due to oxygen may be applied to the photosensitive layer formed. For example, a peelable transparent cover sheet or a coating layer made of wax-like substance having water-soluble or alkaline water-soluble polymer, etc. can be provided on the photosensitive layer.

As the light source used for light irradiation, there can be used conventional light sources generating a visible ray or ultraviolet ray, for example, lasers such as argon laser, helium-cadmium laser, helium-neon laser, krypton laser and semiconductor laser, ultrahigh pressure mercury lamp, high pressure mercury lamp, moderated mercury lamp, low pressure mercury lamp, metal halide lamp, tungsten lamp and the like. Further, in the case of removing the photosensitive layer of the non-exposed part after light irradiation, a suitable developing solution capable of dissolving the photosensitive layer of the non-exposed part may be used.

In the photopolymerizable composition of the present invention, the color of the dye (a) can be removed by light irradiation. Accordingly, the composition can be suitably used for producing a hologram wherein transparency is required, diffraction grating and the like. For example, in the case of producing the hologram, the photosensitive resin plate made by using a transparent substrate such as glass plate and the photopolymerizable composition of the present invention is firstly subjected to a predetermined operation to form an interference fringe of holography. The hologram thus obtained has been colored with the dye (a) as a sensitizer. However, the color of the hologram is removed by additional light irradiation, whereby, a hologram having excellent transparency can be obtained.

In addition to the above applications, the photopolymerizable composition of the present invention can be suitably used for various applications such as normal printing plate, photopolymerizable paint, photoresist for producing printed circuit board and the like.

EXAMPLE

The following Examples further illustrate the present invention in detail but are not to be construed to limit the scope thereof.

Examples 1 to 11

In these Examples, sensitivity and storage stability of the photosensitive resin plate made by using the photopolymerizable composition of the present invention will be explained. In the Examples, all "parts" are by weight unless otherwise stated.

Preparation of photopolymerizable composition

100 Parts of an acrylic polmer having a weight-average molecular weight of 48,000 and an acid value of 75 (trade name of Carboset XL-44, manufactured by BF Goodrich Co.) was dissolved in 700 parts of methyl ethylketone. To the mixture, 100 parts of pentaerythritol triacrylate was dissolved to obtain the first solution.

Then, dyes of the following formulas and maximum absorption wavelength $\lambda_{max}$ A-1 to A-4, polymerization initiators of the following formulas B-1, B-2 and B-3, and auxiliary sensitizers of the following C-1 and C-2 are respectively dissolved in a mixed solution of 300 parts of methylcellosolve and 300 parts of ethyl alcohol in a ratio shown in Table 1 to form the second solution. Total amount of each solution was added to the first solution and sufficiently stirred to obtain a solution of the photopolymerizable composition (photosensitive solution). Further, when insolubles are produced in the composition, they were filtered off.

A-1:

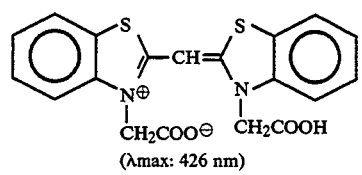

($\lambda$max: 426 nm)

A-2:

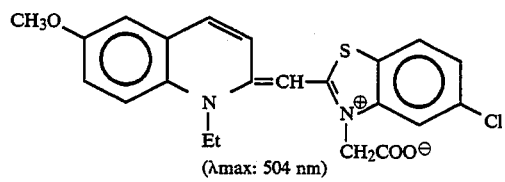

($\lambda$max: 504 nm)

A-3:

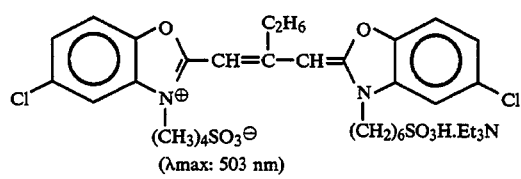

($\lambda$max: 503 nm)

A-4:

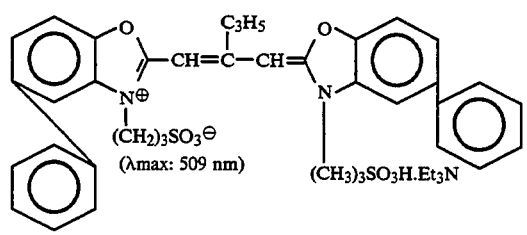

($\lambda$max: 509 nm)

B-1:
Diphenyliodonium chloride
B-2:
Diphenyliodonium tetrafluoroborate
B-3:
4,4'-Ditertiarybutyldiphenyliodonium hexafluoroantimonate
C-1:
N-phenylglycine
C-2:
N-Hydroxyethyl-N-phenylglycine Preparation of photosensitive resin plate The above photosensitive solution was applied on an aluminum substrate using a bar coater so that the amount of coating becomes 2 g/m² on drying, and dried in a drying oven at 60° C. for 3 minutes. A photosensitive layer having a thickness of 2.0 μm was obtained. Further, an aqueous 5% polyvinyl alcohol (saponification degree of 88%, polymerization degree of 500) was applied on the photosensitive layer using a bar coater so that the thickness becomes 2 μm on drying to form an overcoat layer, whereby, a photosensitive resin plate was obtained.

Measurement of sensitivity and storage stability

Each photosensitive resin plate was piled with Step Tablet No. 2 (21 steps) manufactured by Kodak Co. and irradiated for 30 seconds with the light (light intensity of 4.0 mW/cm²) having a wavelength of about 430 nm which was taken out from a xenone lamp (150 W) manufactured by Ushio Denki K.K. through TOSHIBA KL-43 filter, or with the light (light intensity of 4.0 mW/cm²) having a wavelength of about 490 nm which was taken out through TOSHIBA KL-49 filter. Thereafter, the non-cured part of the irradiated photosensitive resin plate was eluted in an aqueous 1% sodium carbonate and sensitivity was evaluated by the number of cured steps. Further, in order to determine storage stability of the photosensitive resin plate, sensitivity changes of the photosensitive resin plate after storage in a dark place at room temperature of 40° C. for 50 days was measured. The results of sensitivity and storage stability are shown in Table 1.

As is apparent from the results shown in Table 1, a photosensitive resin plate made by using the photopolymerizable composition of the present invention is superior in sensitivity to a visible ray having a wavelength at about 400 to 500 nm and in storage stability.

Comparative Examples 1 to 4

In these Comparative Examples, sensitivity and storage stability of the photosensitive resin plate made by using the conventional photopolymerizable composition will be explained.

According to the same manner as that described in Examples 1 to 11 except for using cyanine dyes of the formulas A'-1, A'-2 and A'-3 and having $\lambda_{max}$ at the same wavelength range as that of the dye used in the present invention, a photopolymerizable composition and photosensitive resin plate were made, and sensitivity and storage stability were determined. The results are shown in Table 1.

A'-1:

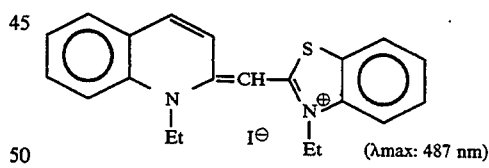

($\lambda$max: 487 nm)

A'-2:

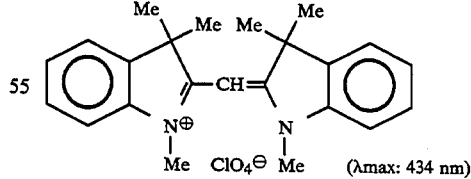

($\lambda$max: 434 nm)

A'-3:

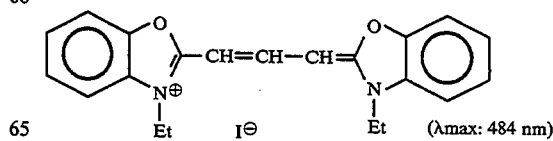

($\lambda$max: 484 nm)

As is apprent from Table 1, a photosensitive resin plate made by using the conventional photopolymerizable composition is inferior in sensitivity to a visible ray having a wavelength at about 500 nm.

TABLE 1

| | Photopolymerization initiating composition (parts by weight)[1] | | | Sensitivity[2] (Number of cured steps) | Storage stability (after storage at 40° C. for 50 days) |
| --- | --- | --- | --- | --- | --- |
| | Component (A) | Component (B) | Component (C) | | |
| Ex. 1 | A-1, 3 parts | B-1, 6 parts | — | 10[3] | No change |
| Ex. 2 | A-1, 3 parts | B-2, 6 parts | — | 10[3] | No change |
| Ex. 3 | A-2, 3 parts | B-1, 3 parts | — | 11 | No change |
| Ex. 4 | A-2, 3 parts | B-1, 6 parts | — | 13 | No change |
| Ex. 5 | A-2, 3 parts | B-3, 6 parts | — | 9 | No change |
| Ex. 6 | A-3, 3 parts | B-2, 6 parts | — | 10 | No change |
| Ex. 7 | A-4, 3 parts | B-1, 6 parts | — | 9 | No change |
| Ex. 8 | A-1, 3 parts | B-1, 6 parts | C-1, 6 parts | 12[3] | No change |
| Ex. 9 | A-2, 3 parts | B-1, 6 parts | C-1, 6 parts | 15 | No change |
| Ex. 10 | A-3, 3 parts | B-2, 6 parts | C-2, 3 parts | 11 | No change |
| Ex. 11 | A-4, 3 parts | B-1, 6 parts | C-2, 6 parts | 11 | No change |
| Comp. Ex. 1 | A'-1, 3 parts | B-1, 6 parts | — | 0 | Not measured because no sensitivity is observed |
| Comp. Ex. 2 | A'-1, 3 parts | B-1, 6 parts | C-1, 6 parts | 0 | Not measured because no sensitivity is observed |
| Comp. Ex. 3 | A'-2, 3 parts | B-1, 6 parts | — | 0[3] | Not measured because no sensitivity is observed |
| Comp. Ex. 4 | A'-3, 3 parts | B-1, 6 parts | — | 0 | Not measured because no sensitivity is observed |

[1]Ratio based on 100 parts by weight of pentaerythritol triacrylate [component (d)]
[2]The larger the number, the higher sensitivity is.
[3]Wavelength of irradiated light is about 430 nm (that of others is about 490 nm).

EXAMPLE 12

In this Example, the fact that the halogram made by using the photopolymerizable composition of the present invention is easily decolored by light irradiation will be explained.

According to the same manner as that described in Examples 1 to 11 except for using the following formulation shown in Table 2, a photopolymerizable composition was prepared.

TABLE 2

| | |
| --- | --- |
| Acrylic resin (BR-77, manufactured by Mithusbishi Rayon Co. Ltd.) | 10 g |
| Pentaerythritol triacrylate | 8 g |
| Dye A-2 | 0.05 g |
| Diphenyliodonium tetrafluoroborate | 0.5 g |
| Methyl ethyl ketone | 30 g |
| 2-Methoxyethanol | 20 g |

Then, the photopolymerizable composition was applied on a glass plate as a substrate and dried to form a photosensitive layer. In that case, application of the photopolymerizable composition was conducted using an applicator so that the thickness of the resulting photosensitive layer becomes 5 μm and drying was conducted at a temperature of 80° C. for 5 minutes. An aqueous 10% polyvinyl alcohol (GL-05, manufactured by Nihon Gosei Kagaku Co. Ltd.) was applied on the photosensitive layer and dried to form a polovinyl alcohol layer having a thickness of 5 μm, whereby, a photosensitive resin plate for hologram recording was obtained.

Thereafter, a light having a wavelength of 514.5 nm and an energy of 50 mJ/cm² was irradiated on the photosensitive resin plate using a two light flux interference optical device for producing hologram and an argon laser to form a pattern of an interference wave of holography. The photosensitive resin plate on which the pattern of the interference wave has been formed was subjected to a developing operation (dipping in an ethanol for 30 seconds and additional dipping in heptane for 30 seconds) to obtain a Lippmann tupe hologram.

The resulting hologram was colored orange according to a dye A-2 used as a sensitizer of the photopolymerizable composition. However, the hologram was irradiated from the distance of 50 cm for 10 minutes using a 3 kW ultrahigh pressure mercury lamp and, as a result, the hologram was decolored and it became transparent.

Effect of the Invention

According to the present invention, there is provided a photopolymerizable composition having excellent storage stability and excellent sensitivity to a visible ray (particularly, a visible ray having a wavelength of not more than about 550 nm), which can provide a photosensitive resin plate capable of decoloring by light irradiation.

We claim:

1. A photopolymerizable composition comprising an addition polymerizable compound having an ethylenically unsaturated double bond and a photopolymerization initiating composition, said photopolymerizable initiating composition comprising (a) a dye of the formula:

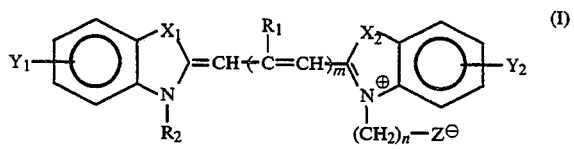

(I)

wherein $R_1$ is H, an alkyl group having 1 to 3 carbon atoms, a phenyl group or a halogen atom; $R_2$ is a methyl group, an ethyl group or $(CH_2)_p$-Q (wherein Q is a carboxyl group, a sulfonyl group or salt thereof and p is an integer of 1 to 4); $X_1$ and $X_2$ are independently —O—, —S—, —CH=CH— or >N—$R_2$; $Y_1$ and $Y_2$ are independently H, an alkyl group having 1 to 3 carbon atoms, an alkoxy group having 1 to 3 carbon atoms, a phenyl group or a halogen atom; Z is —COO or —$SO_3$; m is 0 or 1; and n is an integer of 1 to 4, and (b) diaryliodonium salt as a polymerization initiator.

2. The photopolymerizable composition according to claim 1, wherein the photopolymerization initiating composition further contains (c) an auxiliary sensitizer of the formula:

$$R_3\text{-A-CH}_2\text{COOH}$$

wherein $R_3$ is a phenyl group or a substituted phenyl group; and A is —O—, —S—, or —N(R)—, wherein R represents a hydrogen atom, —CH$_2$CH$_2$OH or —CH$_2$CH(OH)CH$_2$OCOC(CH$_3$)=CH$_2$.

* * * * *